(12) United States Patent
Lee et al.

(10) Patent No.: US 9,030,873 B2
(45) Date of Patent: May 12, 2015

(54) SEMICONDUCTOR DEVICE AND METHOD OF OPERATING THE SAME

(71) Applicant: SK Hynix Inc., Icheon-si Gyeonggi-do (KR)

(72) Inventors: Sang Kyu Lee, Chungcheongbuk-do (KR); Min Ho Her, Cheongju-si (KR); Myung Su Kim, Guri-si (KR)

(73) Assignee: SK Hynix Inc., Gyeonggi-do (KR)

( * ) Notice: Subject to any disclaimer, the term of this patent is extended or adjusted under 35 U.S.C. 154(b) by 177 days.

(21) Appl. No.: 13/717,385

(22) Filed: Dec. 17, 2012

(65) Prior Publication Data

US 2014/0063971 A1  Mar. 6, 2014

(30) Foreign Application Priority Data

Aug. 28, 2012 (KR) ......................... 10-2012-0094349

(51) Int. Cl.
| | |
|---|---|
| *G06F 11/08* | (2006.01) |
| *G11C 16/10* | (2006.01) |
| *G11C 16/04* | (2006.01) |
| *G11C 16/26* | (2006.01) |
| *G11C 16/34* | (2006.01) |

(52) U.S. Cl.
CPC ................. *G11C 16/10* (2013.01); *G11C 16/04* (2013.01); *G11C 16/0483* (2013.01); *G11C 16/26* (2013.01); *G11C 16/3404* (2013.01); *G11C 16/349* (2013.01)

(58) Field of Classification Search
CPC ......... G11C 16/06; G11C 16/28; G11C 11/56
USPC ............. 365/185.22, 185.12, 185.09, 185.18, 365/200
See application file for complete search history.

(56) References Cited

U.S. PATENT DOCUMENTS

| 8,510,636 | B2 * | 8/2013 | Ruby et al. .................... 714/773 |
| 8,605,505 | B2 * | 12/2013 | Kim .......................... 365/185.09 |
| 8,793,558 | B2 * | 7/2014 | Cunningham et al. ........ 714/774 |
| 2007/0091677 | A1 * | 4/2007 | Lasser et al. ............. 365/185.09 |
| 2013/0073924 | A1 * | 3/2013 | D'Abreu et al. .............. 714/763 |

FOREIGN PATENT DOCUMENTS

KR  1020100124892 A  11/2010

* cited by examiner

*Primary Examiner* — Han Yang
*Assistant Examiner* — Xiaochun L Chen
(74) *Attorney, Agent, or Firm* — William Park & Associates Ltd.

(57) ABSTRACT

A method of operating a semiconductor device includes storing a supplying condition of a read voltage inputted from an external source into an internal register to perform a read operation of memory cells, performing the read operation repetitively with changing levels of the read voltage according to the supplying condition of the read voltage in the event that the number of error bits in a data read from the memory cells exceeds an allowable range, and storing an iteration number of the read operation in the internal register in case the number of the error bits falls within the allowable range.

17 Claims, 6 Drawing Sheets

SEMICONDUCTOR DEVICE AND METHOD OF OPERATING THE SAME

CROSS-REFERENCE TO RELATED APPLICATION

This application claims priority from Korean Patent Application No. 10-2012-0094349, filed on Aug. 28, 2012, the contents of which are incorporated herein by reference in its entirety.

BACKGROUND

The present invention relates generally to a semiconductor device and a method of operating the same, and more particularly relates to a semiconductor device including memory cells and a method of operating the same.

A semiconductor memory device may be classified into a volatile memory device or a non-volatile memory device.

In the volatile memory device, the memory cell maintains the stored data even if power is not supplied. A representative non-volatile semiconductor memory device is a NAND flash memory device.

The NAND flash memory device stores 2 bits of data in a memory cell. Accordingly, if a program operation for storing data in memory cells is completed, threshold voltages of the memory cells have an erase level, and a first to a third program levels. In a read operation, voltages between threshold voltage distributions are used as a read voltage so as to classify the threshold voltages of the memory cells.

Since the distance between memory cells becomes narrower to enhance integrity and interference occurs between adjoining memory cells, data read according to the read operation includes error bits. The error bits may be corrected through an error correction code (ECC) unit when the number of error bits is smaller than a preset value, but errors may occur when the number of error bits is higher than the preset value.

Accordingly, a method of minimizing the number of error bit in a data read operation from the memory cells has been required.

SUMMARY OF THE INVENTION

Various embodiments of the present invention provide a semiconductor device for minimizing the number of error bits in data read from memory cells and a method of operating the same.

A method of operating a semiconductor device according to an embodiment of the present invention includes storing a supplying condition of a read voltage inputted from an external source into an internal register to perform a read operation of memory cells, performing the read operation repetitively with changing levels of the read voltage according to the supplying condition of the read voltage in the event that the number of error bits in a data read from the memory cells exceeds an allowable range, and storing an iteration number of the read operation in the internal register in case the number of the error bits falls within the allowable range.

A semiconductor device according to an embodiment of the present invention includes a memory array configured to include memory cells, an operation circuit configured to perform a read operation of the memory cells, and a control circuit configured to include an internal register for storing a supplying condition of a read voltage inputted from an external source to perform a read operation of the memory cells and for storing an iteration number of the read operation in case that the number of the error bits falls within the allowable range, and to control the operation circuit to perform the read operation repetitively with changing levels of the read voltage according to the supplying condition of the read voltage in the event that the number of errors bit in a data read from the memory cells exceeds an allowable range.

A semiconductor device of the present invention may minimize the number of error bits in a data read from memory cells, thereby enhancing reliability thereof. Additionally, a read operation may automatically repeat according to a supplying condition of a read voltage of a chip irrespective of a test device.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

Figure 1:
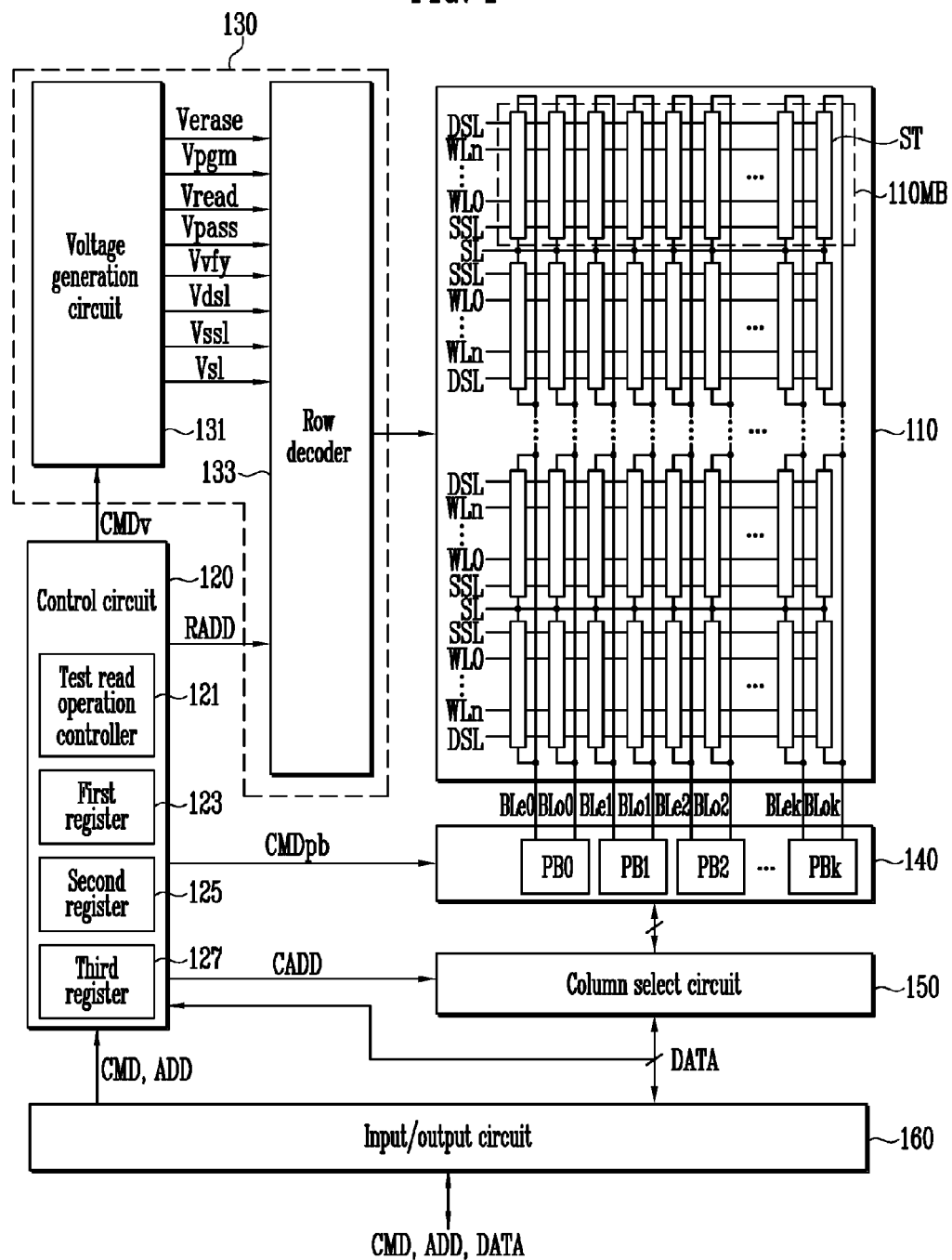
FIG. 1 is a block diagram illustrating a semiconductor device according to an embodiment of the present invention.

FIG. 1 is a block diagram illustrating a semiconductor device according to an embodiment of the present invention.

In FIG. 1, the semiconductor device includes a memory array 110 and a peripheral circuits 120 to 160. The peripheral circuits include a control circuit 120 and operation circuits 130 to 160. In a flash memory device, the operation circuits may collectively perform a read operation, a program operation, and an erase operation of memory cells, and include a voltage supplying circuit 130, a page buffer group 140, a column select circuit 150, and an input/output circuit 160. The control circuit 120 controls the operation circuits 130 to 160.

The memory array 110 includes memory blocks 110MB. Each of the memory blocks 110MB may include memory strings ST. Hereinafter, the memory block 110MB will be described in detail.

Figure 2:
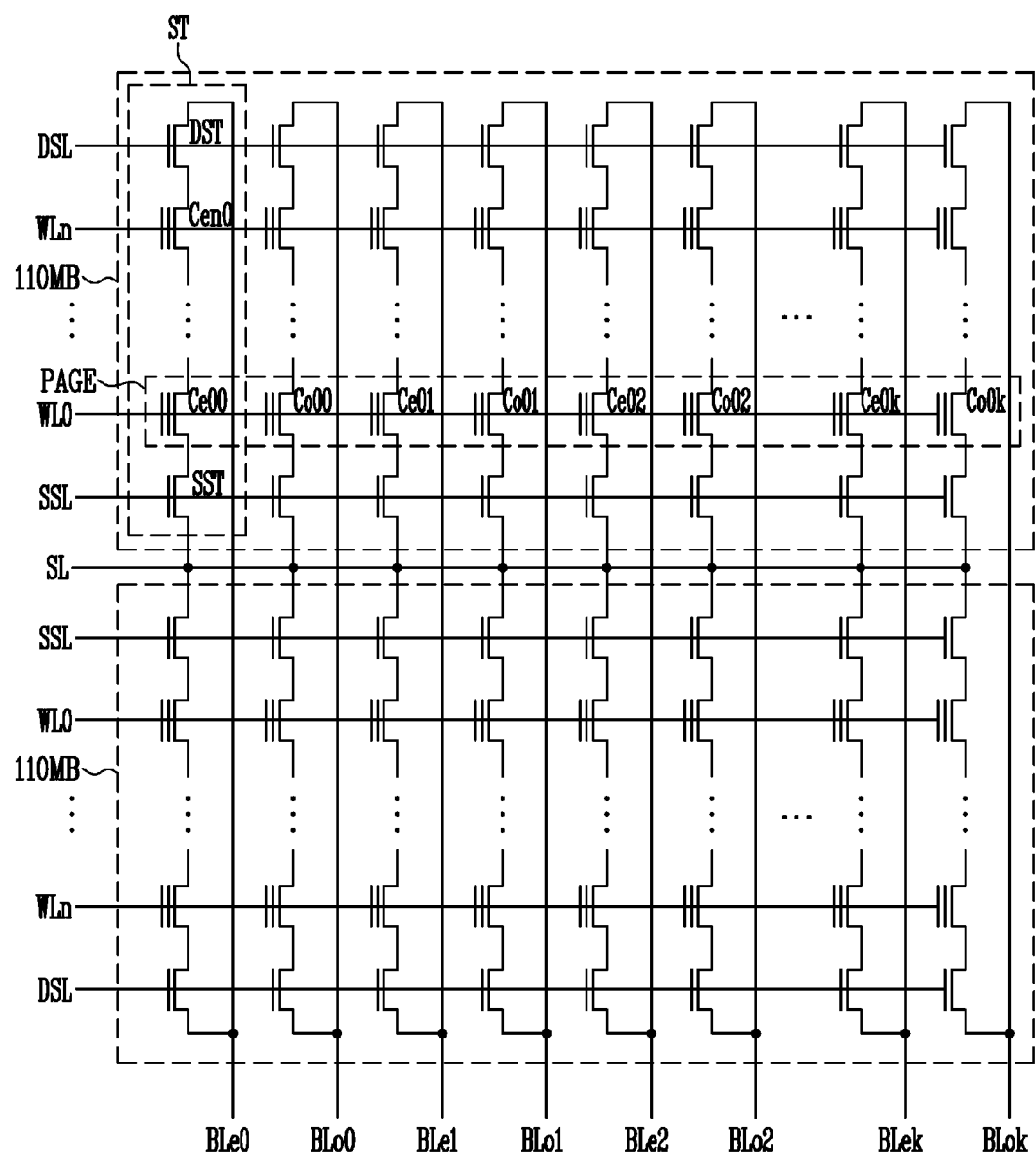
FIG. 2 is a view illustrating a circuit diagram of the memory block in FIG. 1.

FIG. 2 is a view illustrating a circuit diagram of the memory block in FIG. 1.

In FIG. 2, each of the memory blocks includes memory strings ST coupled between bit lines BLe0~BLek and BLo0~BLok and a common source line SL. That is, the memory strings ST are coupled to the bit lines BLe0-BLek and BLo0-BLok and are coupled in common to the common source line SL. Each of the memory strings ST includes a source select transistor SST, a cell string where memory cells Ce00-Cen0 are coupled in serial, and a drain select transistor DST, where a source of the source select transistor SST being coupled to the common source line SL and a drain of the drain select transistor DST is coupled to a bit line BLe0. The memory cells Ce00-Cen0 in the cell string are coupled in serial between the select transistors SST and DST. A gate of the source select transistor SST is coupled to a source select line SSL, gates of the memory cells Ce00-Cen0 are coupled to word lines WL0-WLn, and a gate of the drain select transistor DST is coupled to a drain select line DSL.

The drain select transistor DST controls coupling or blocking between the memory cells Ce00-Cen0 and a bit line, and the source select transistor SST controls coupling or blocking between the memory cells Ce00-Cen0 and the common source line SL.

In the NAND flash memory device, the memory cells in the memory block may be divided into a physical page and a logical page. For example, memory cells Ce00-Ce0*k* and Co00-Co0*k* coupled to one word line, e.g. WL0, form one physical page PAGE. Even-numbered memory cells Ce00-Ce0*k* coupled to one word line, e.g. WL0 may form one even physical page, and odd-numbered memory cells Co00-Co0*k* may form one odd physical page. The page, whether even or odd, may be a reference unit of a program operation or a read operation.

Referring to FIG. 1 and FIG. 2, the peripheral circuits 120 to 160 may collectively perform an erase loop, a program loop, and a read operation of the memory cells, e.g. Ce00-Ce0*k*, coupled to a selected word line, e.g. WL0. The peripheral circuits may include a control circuit 120 for collectively controlling the program loop, a read loop, and an erase operation, and operation circuits 130 to 160 for collectively performing the program loop, the read loop, and the erase operation. To perform the program loop, the read loop, and the erase operation, the operation circuits 130 to 160 selectively output operation voltages Verase, Vpgm, Vread, Vpass, Vvfy, Vdsl, Vssl and Vsl to local lines SSL, WL0-WLn, DSL, and SL of a selected memory block, precharges/discharges the bit lines BLe0-BLek and BLo0-BLok, or senses current on the bit lines BLe0-BLek and BLo0-BLok. For the NAND flash memory device, the operation circuit may include the voltage supplying circuit 130, the page buffer group 140, the column select circuit 150, and the input/output circuit 160. Hereinafter, the elements will be described in detail.

The control circuit 120 outputs a voltage control signal CMDv for controlling the voltage supplying circuit 130 in response to a command signal CMD inputted through the input/output circuit 160 from an external source, and the voltage supplying circuit 130 generates the operation voltages Verase, Vpgm, Vread, Vpass, Vvfy, Vdsl, Vssl and Vsl for performing the program loop, the read operation, or the erase loop with desired levels according to the voltage control signal CMDv. The control circuit 120 outputs control signal CMDpb for controlling page buffers PB0-PBk included in the page buffer group 140 to perform the program loop, the read loop, or the erase loop. The control circuit 120 generates a column address signal CADD and a row address signal RADD in response to inputted address signal ADD, and outputs the column address signal CADD and the row address signal RADD.

The control circuit 120 may include internal registers 123, 125, and 127 for storing a supplying condition of a read voltage Vread inputted from an external source and an iteration number of the read operation so as to perform the read operation of memory cells, and a test read operation controller 121 for controlling the operation circuits 130 to 160 to repetitively perform the read operation with changing levels of the read voltage Vread according to the supplying condition of the read voltage Vread if the number of error bits in a data read from the memory cells exceeds an allowable range. This will be described in detail below.

The voltage supplying circuit 130 generates the operation voltages Verase, Vpgm, Vread, Vpass, Vvfy, Vdsl, Vssl, and Vsl for the program loop, the read operation, or the erase loop of memory cells in response to the voltage control signal CMDv of the control circuit 120, and outputs the operation voltages to the local lines SSL, WL0-WLn, DSL, and SL of the selected memory block in response to the row address signal RADD.

The voltage supplying circuit 130 may include a voltage generation circuit 131 and a row decoder 133. The voltage generation circuit 131 generates the operation voltages Verase, Vpgm, Vread, Vpass, Vvfy, Vdsl, Vssl, and Vsl in response to the voltage control signal CMDv of the control circuit 120, and supplies the operation voltages to the local lines SSL, WL0-WLn, DSL, and SL of the memory blocks 110MB in response to the row address signal RADD of the control circuit 120.

Output and change of the operation voltages Verase, Vpgm, Vread, Vpass, Vvfy, Vdsl, Vssl, and Vsl may be controlled by the voltage supplying circuit 130 in response to the voltage control signal CMDv of the control circuit 120. When the read operation is performed in a test mode, output and change of the read voltage Vread may be controlled according to the supplying condition of the read voltage stored in the register, e.g. 123 of the control circuit 120 and the test read operation controller 121.

The page buffer group 140 may include the page buffers PB0-PBk coupled to the memory array 110 through the bit lines BLe0-BLek and BLo0-BLok. In the program operation, the page buffers PB0-PBk selectively precharge the bit lines BLe0-BLek and BLo0-BLok according to the operation control signal CMDpb of the control circuit 120 and data DATA to be stored in the memory cell. In a program verifying operation or a read operation, the page buffers PB0-PBk sense current on the bit lines BLe0-BLek and BLo0-BLok after precharging the bit lines BLe0-BLek and BLo0-BLok in response to the operation control signal CMDpb of the control circuit 120, and latch data read from the memory cell according to the sensing result. Each of the page buffers PB0-PBk may be coupled to the bit lines, and particularly coupled to pairs of the even bit lines BLe0-BLek and the odd bit lines BLo0-BLok.

The column select circuit 150 selects the page buffers PB0-PBk in the page buffer group 140 in response to the column address signal CADD outputted from the control circuit 120. That is, the column select circuit delivers data sequentially to be stored in memory cells to the page buffers PB0-PBk in response to the column address signal CADD. Additionally, the column select circuit 150 selects sequentially the page buffers PB0-PBk in response to the column address signal CADD, to output the data in the memory cells latched in the page buffers PB0-PBk in accordance with the read operation to an external device.

The input/output circuit 160 delivers the command signal CMD and the address signal ADD inputted from an external source to the control circuit 120. Furthermore, the input/ output circuit 160 delivers the data DATA inputted from the external source to the column select circuit 150 when the program operation is performed, or outputs the data read from the memory cells to the external device when the read operation is performed.

Figure 3A:
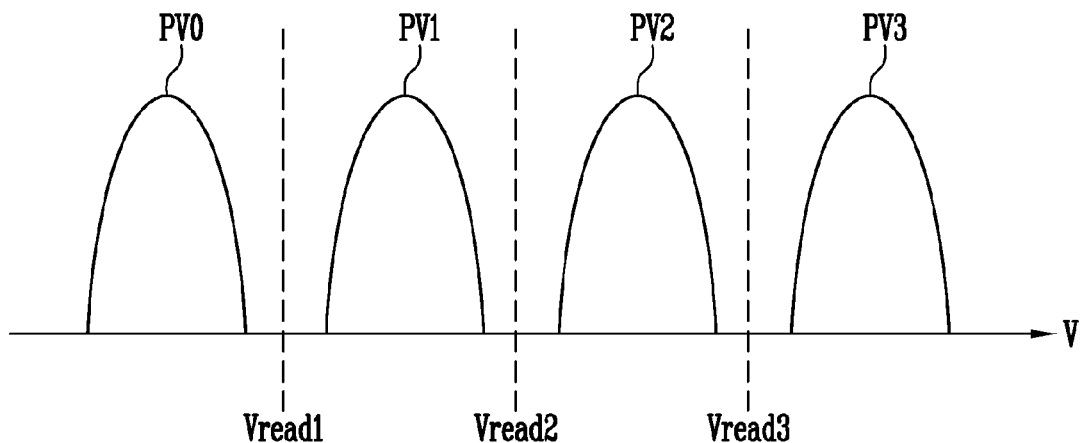
FIG. 3A and FIG. 3B are views illustrating threshold voltage distribution of memory cells in FIG. 1.
Figure 3B:
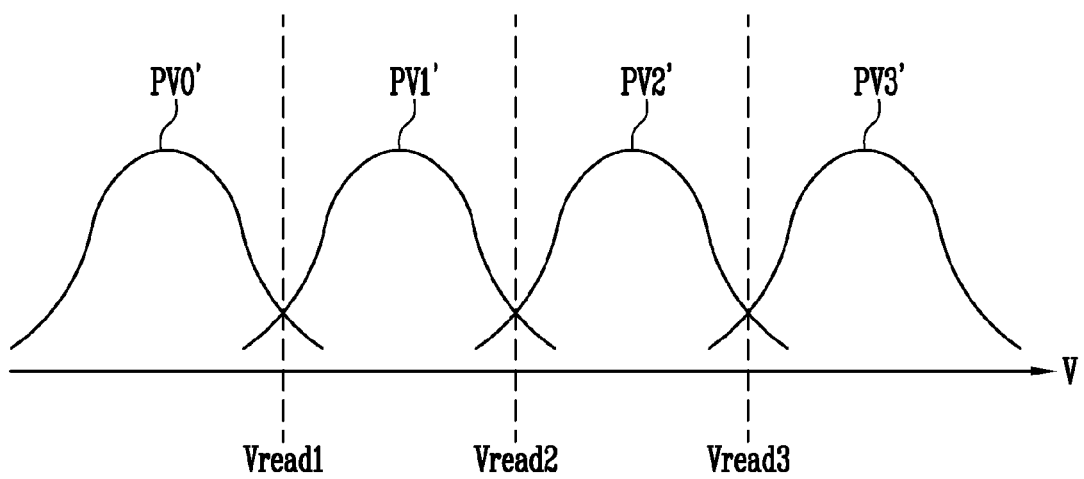

FIG. 3A and FIG. 3B are views illustrating threshold voltage distribution of memory cells in FIG. 1.

In FIG. 3A, threshold voltage distributions of the memory cells may be divided into an erase level PV0 and a first to a third program levels PV1 to PV3 in the case where 2 bits of data are stored in the memory cells. The threshold voltage distributions have ideally constant intervals to provide read margins. Levels of the threshold voltages of the memory cells are separated by using read voltages Vread1-Vread3 corresponding to levels between the threshold voltage distribution, and the data in the memory cells may be read in accordance with the separated levels.

In FIG. 3B, intervals between the memory cells become narrower accordingly as the size of the memory cells reduces so as to enhance integrity, and so interference may occur between adjoining memory cells when the program operation for storing data in the memory cells is performed. The threshold voltage of the memory cell may be changed due to the interference, and intervals between the threshold voltage distributions PV0'-PV3' become narrower and/or the threshold voltage distributions PV0'-PV3' overlap if the threshold voltage increases. As a result, error bits are included in the data read in the read operation, and the number of error bits increase if the interference augments. The error bits in the data may be corrected by an error correction code ECC unit, but they may not be corrected when the number of error bits exceeds the maximum number of correctable bits.

To solve the above problem, the present invention provides a test read operation to change levels of the read voltage so that the number of error bits is generated within the range of the maximum number of correctable bits.

The levels of the read voltage for the test read operation is determined by a test device, and the data read by the read voltage having a determined level and a reference data are compared. The number of error bits may be verified through the comparing result, the test device changes levels of the read voltage if the number of error bits exceeds the allowable range, and data read in accordance with the read voltage having changed levels is compared again with the reference data. These processes are repeated, and thus levels of the read voltage used when the number of error bits corresponds to the allowable range may be verified. The read voltage supplied in the read operation is set according to the verified result, and so error may be minimized.

However, much time is required because the test device adjusts the levels of the read voltage, and a low-quality test device which does not adjust levels of the read voltage is not able to detect optimized read voltage. Hereinafter, the present invention provides a method for enhancing reliability by minimizing the number of error bits in data read from the memory cells and automatically repeating the read operation according to a supplying condition of the read voltage so as to set an optimized read voltage in a chip irrespective of the test device.

Figure 4:
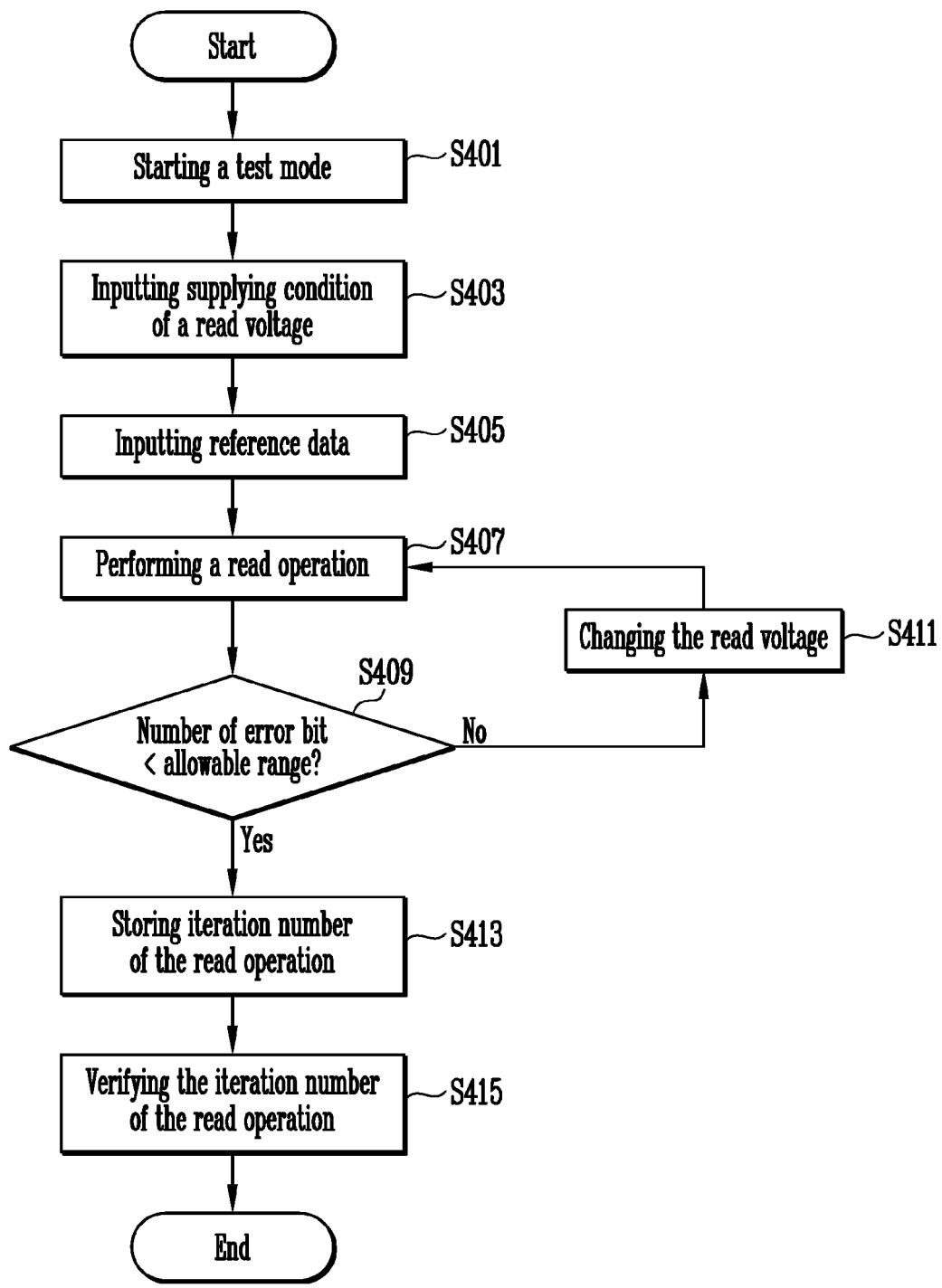
FIG. 4 is a flowchart illustrating operation of a semiconductor device according to an embodiment of the present invention.

FIG. 4 is a flowchart illustrating operation of a semiconductor device according to an embodiment of the present invention.

Referring to FIG. 1 and FIG. 4, a test mode starts in step S401. A test read command signal is inputted, and a memory chip starts the test mode. Inn summary, S401 indicates a test read operation mode.

In steps S403 and S405, a bias table corresponding to a supplying condition of a read voltage Vread and a reference data are inputted from an external source. The inputted supplying condition and the reference data are stored in the internal registers 123, 125, and 127 of the control circuit 120. The supplying condition of the read voltage may include a minimum level of the read voltage, a maximum level of the read voltage, change levels of the read voltage and the maximum allowable number. Initial read voltage is set according to the supplying condition of the read voltage.

An address signal for selecting memory cells to be read may also be inputted. The address signal is used for selecting one word line or one page in a specific memory block, and may be stored in the register which stores the supplying condition and the reference data. The control circuit 120 may generate the row address signal RADD and the column address signal CADD according to the stored address signal.

The internal registers 123, 125, and 127 may store a supplying condition of voltages for the program operation, the read operation, or the erase operation of memory cells after the test mode is completed. Accordingly, additional registers for the test mode are not needed.

Figure 5:
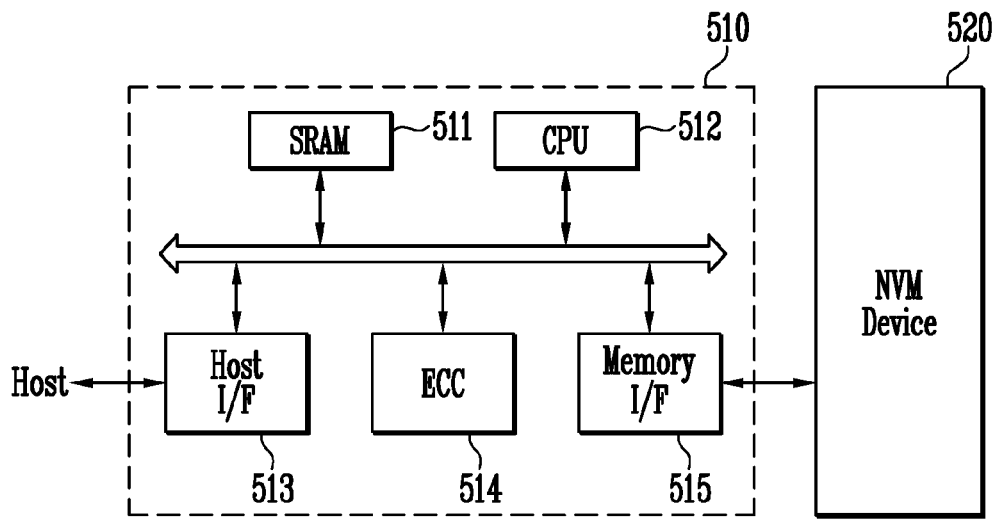
FIG. 5 is a block diagram illustrating schematically a memory system according to an embodiment of the present invention.

A test read operation is performed repeatedly in the chip according to the supplying condition of the read voltage in the event that the test read command signal is inputted, irrespective of control of an external controller, e.g. 510 in FIG. 5. Subsequently, a test read operation is performed according to the supplying condition of the read voltage stored in the registers 123, 125, and 127 and control of the test read operation controller 121.

In step S407, the read operation is performed. The voltage supplying circuit 130 supplies set read voltage Vread to a selected word line, e.g. WL0 of a selected memory block 110MB according to the voltage control signal CMDv and the row address signal RADD of the control circuit 120, and supplies a pass voltage Vpass to the other word lines, e.g. WL1-WLn. The page buffers PB0-PBk latch data stored in the memory cells by the sensing voltage or current of the bit line.

In step S409, the control circuit 120 compares the data latched in the page buffers PB0-PBk, i.e. data read from the memory cell with the reference data stored in the registers 123, 125, and 127. An extra comparing circuit (not shown) may be included so as to compare the read data with the reference data and to verify pass or fail of the read operation in accordance with the number of error bits in the read data. The reference data may be stored in the memory cells before the data is read from the memory cells.

If the number of error bits in the read data exceeds the allowable range, e.g. the maximum number of correctable bits according to the comparing result, the test read operation controller 121 controls the voltage supplying circuit 130 to change levels of the read voltage Vread in accordance with the supplying condition of the read voltage stored in the registers 123, 125, and 127.

In step S407, the read operation is performed again by using the read voltage Vread having a changed level. Data read from the memory cells by the read voltage Vread having the changed level is latched in the page buffers PB0-PBk.

In step S409, the read data and the reference data are compared again.

If the read data falls within the allowable range, e.g. maximum number of correctable bits by the ECC unit in accordance with the comparing result, the test read operation controller 121 stores the test result in the registers 123, 125, and 127 in step S413. For example, the test read operation controller 121 may store an iteration number of the read operation in the registers 123, 125, and 127.

In step S415, the iteration number of the read operation is outputted to an external device so as to verify the iteration number of the read operation stored in the internal register.

As described above, in the event that the test read command signal is inputted and the supplying condition of the read voltage and data needed for the read operation are stored, the test read operation may be performed repetitively in the chip according to the supplying condition of the read voltage, irrespective of control of the external controller or the test device. Accordingly, the optimized read voltage may be set through only internal operation of the chip irrespective of the external controller, etc.

FIG. 5 is a block diagram illustrating schematically a memory system according to an embodiment of the present invention.

In FIG. 5, the memory system 500 of the present embodiment may include a non-volatile memory device 520 and a memory controller 510.

The non-volatile memory device 520 may be embodied as the semiconductor device described above. The memory controller 510 controls the non-volatile memory device 520 in a common operation mode such as a program operation, a read operation, or an erase operation. In the test mode for the test read operation, data such as the supplying condition of the read voltage, the reference data, and the address signal may be directly inputted into the non-volatile memory device from a host, and not inputted through an external controller.

The memory device 500 including the non-volatile memory device 520 and the memory controller 510 may be used as a memory card or a solid state disk SSD. An SRAM 511 is used as an operation memory of a processing unit 512. A host interface 513 includes a data exchange protocol of the host coupled to the memory system 500. An error correction block 514 checks and corrects error bit in data read from the non-volatile memory device 520. A memory interface 514 interfaces with the non-volatile memory device 520 of the present invention. The processing unit performs control operation for data exchange.

The memory system 500 may further include a ROM (not shown) for storing code data for interfacing with the host and so on. The non-volatile memory device 520 may be provided in a multi-chip package including flash memory chips. The memory system 500 of the present invention may be used as a storage medium having low error probability, i.e. high reliability. The flash memory device of the present invention may be used in a memory system such as the SSD. In this case, the memory controller 510 may communicate with an external device, e.g. a host through one of various interface protocols such as USB, MMC, PCI-E, SATA, PATA, SCSI, ESDI and IDE, etc.

Figure 6:
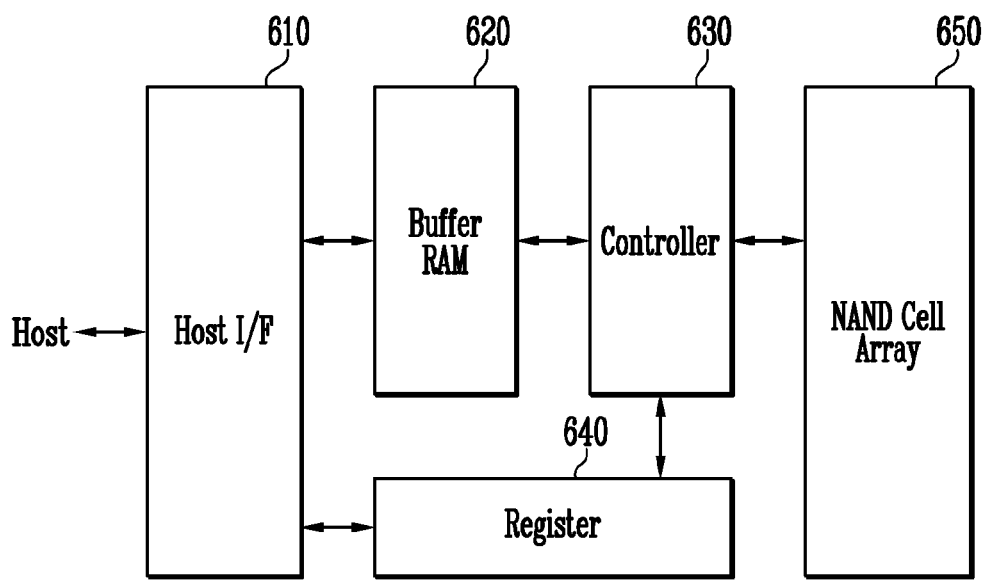
FIG. 6 is a block diagram illustrating schematically a fusion memory device or a fusion memory system for performing a program operation according to embodiments of the present invention.

FIG. 6 is a block diagram illustrating schematically a fusion memory device or a fusion memory system for performing a program operation according to an embodiments of the present invention. For example, the present invention may be applied to a NAND flash memory device 600 as the fusion memory device.

The NAND flash memory device 600 includes a host interface 610 for exchanging information with a device using different protocols, a buffer RAM 620 for embedding code for driving the memory device or storing data, a controller 630 for controlling reading, programming, and every state in response to a control signal and a command inputted from an external device, a register 640 for storing data such as configuration for defining command, address, and a system operation environment in the memory device, and a NAND flash cell array 650 having an operation circuit including a non-volatile memory cell and a page buffer. A memory array of the NAND flash cell array 650 may be applied with the memory array in FIG. 2.

Figure 7:
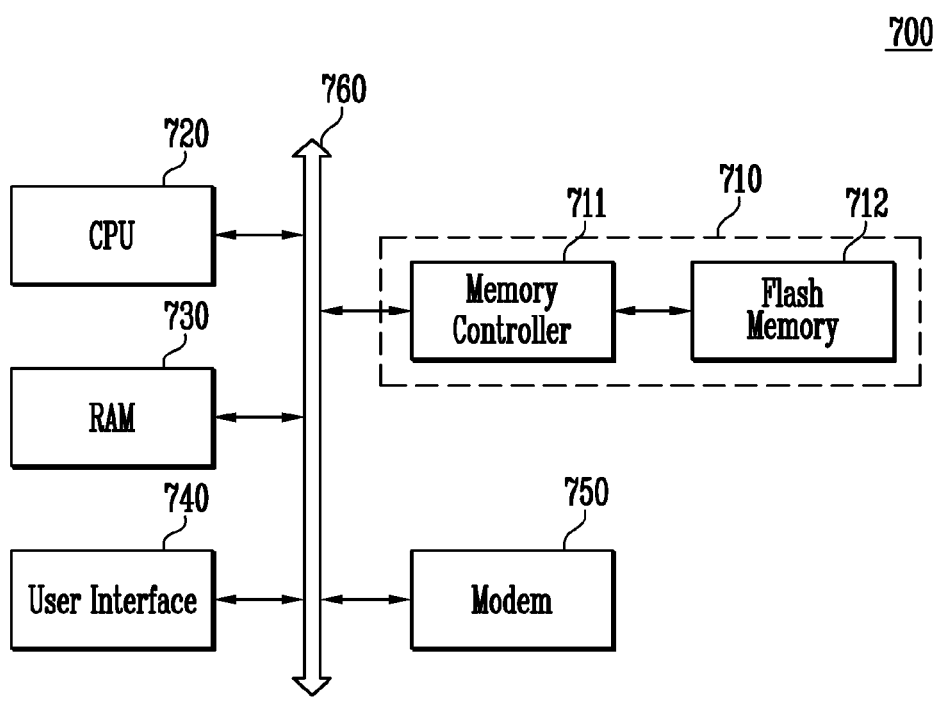
FIG. 7 is a view illustrating schematically a computing system including a flash memory device according to an embodiment of the present invention.

FIG. 7 is a view illustrating schematically a computing system including a flash memory device according to an embodiment of the present invention.

The computing system 700 of the present invention includes a microprocessor 720 connected electrically to a system bus 760, a RAM 730, a user interface 740, a modem 750 such as a baseband chipset, and a memory system 710. In case that the computing system 700 is a mobile device, a battery (not shown) for supplying an operation voltage of the computing system 700 may be further provided. The computing system 700 of the present invention may further include an application chipset, a camera image processor CIS, a mobile DRAM, etc., which are not shown. The memory system 710 may include an SSD using for example a non-volatile memory for storing data. The memory system 710 may be applied to a fusion flash memory, e.g. a NAND flash memory.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor device, the method comprising:
storing a supplying condition of a read voltage inputted from an external source into an internal register to perform a read operation of memory cells;
performing the read operation repetitively with changing levels of the read voltage according to the supplying condition of the read voltage in the event that the number of error bits in a data read from the memory cells exceeds an allowable range; and
storing an iteration number of the read operation in the internal register in case the number of the error bits falls within the allowable range,
wherein the iteration number of the read operation stored in the internal register is outputted to an external source.

2. The method of claim 1, wherein the read operation is performed in a test mode.

3. The method of claim 1, further comprising: comparing the data with reference data to verify the number of error bits in the data.

4. The method of claim 3, wherein the reference data is stored in the internal register when the supplying condition of the read voltage is stored in the internal register.

5. The method of claim 1, wherein an address signal for selecting the memory cells is stored in the internal register when the supplying condition of the read voltage is stored in the internal register.

6. The method of claim 2, wherein the supplying condition of voltages for a program operation, a read operation, or an erase operation of the memory cells is stored in the internal register after the test mode is complete.

7. The method of claim 2, wherein the supplying condition of the read voltage is directly inputted from a host in the test mode.

8. The method of claim 1, wherein the supplying condition of the read voltage includes a minimum level of the read voltage, a maximum level of the read voltage, change levels of the read voltage, and a maximum allowable number of the read operation.

9. The method of claim 1, wherein the read operation is performed repetitively according to the supplying condition of the read voltage when a test read command signal is inputted.

10. A semiconductor device comprising:
a memory array configured to include memory cells;
an operation circuit configured to perform a read operation of the memory cells; and
a control circuit configured to include an internal register for storing a supplying condition of a read voltage and reference data inputted from an external source to perform a read operation of the memory cells and for storing an iteration number of the read operation in case that the number of the error bits falls within the allowable range, to compare the data read from the memory cells with the reference data inputted from the external source to verify the number of error bits in the data, and to control the operation circuit to perform the read operation repetitively with changing levels of the read voltage according to the supplying condition of the read voltage in the event that the number of error bit in the data read from the memory cells exceeds an allowable range.

11. The semiconductor device of claim 10, wherein the control circuit controls the operation circuit to repetitively perform the read operation with changing the levels of the read voltage in a test mode.

12. The semiconductor device of claim 10, wherein an address signal for selecting the memory cells is stored in the internal register when the supplying condition of the read voltage is stored in the internal register.

13. The semiconductor device of claim 10, wherein the iteration number of the read operation stored in the internal register is outputted to an external source through an input/output circuit of the operation circuit.

14. The semiconductor device of claim 10, wherein the supplying condition of voltages for a program operation, a read operation, or an erase operation of the memory cells is stored in the internal register after a test mode is complete.

15. The semiconductor device of claim 10, wherein the supplying condition of the read voltage is directly inputted from a host in a test mode.

16. The semiconductor device of claim 10, wherein the supplying condition of the read voltage includes a minimum level of the read voltage, a maximum level of the read voltage, change levels of the read voltage, and a maximum allowable number of the read operation.

17. The semiconductor device of claim 10, wherein the operation circuit controlled by the control circuit repetitively performs the read operation according to the supplying condition of the read voltage when a test read command signal is inputted.

* * * * *